(12) United States Patent
Berrian

(10) Patent No.: US 7,247,863 B2
(45) Date of Patent: Jul. 24, 2007

(54) SYSTEM AND METHOD FOR RAPIDLY CONTROLLING THE OUTPUT OF AN ION SOURCE FOR ION IMPLANTATION

(75) Inventor: Donald W. Berrian, Topsfield, MA (US)

(73) Assignee: Axcellis Technologies, Inc., Beverly, MA (US)

( * ) Notice: Subject to any disclaimer, the term of this patent is extended or adjusted under 35 U.S.C. 154(b) by 1009 days.

(21) Appl. No.: 10/032,664

(22) Filed: Oct. 19, 2001

(65) Prior Publication Data

US 2002/0053642 A1    May 9, 2002

Related U.S. Application Data

(60) Provisional application No. 60/242,288, filed on Oct. 20, 2000.

(51) Int. Cl.
*H01J 37/08*     (2006.01)
(52) U.S. Cl. .................................... 250/427; 250/423 R
(58) Field of Classification Search .................... None
See application file for complete search history.

(56) References Cited

U.S. PATENT DOCUMENTS

| | | | | |
|---|---|---|---|---|
| 4,339,691 A | * | 7/1982 | Morimiya et al. | ...... 315/111.21 |
| 4,684,848 A | * | 8/1987 | Kaufman et al. | ....... 315/111.81 |
| 4,754,200 A | | 6/1988 | Moeller | |
| 5,262,652 A | | 11/1993 | Bright et al. | |
| 5,438,238 A | * | 8/1995 | Toy et al. | ...................... 315/94 |
| 5,675,152 A | * | 10/1997 | Wong | .......................... 250/427 |
| 6,184,532 B1 | * | 2/2001 | Dudnikov et al. | ...... 250/423 R |
| 6,627,901 B2 | * | 9/2003 | Martinez | ..................... 250/427 |
| 6,686,601 B2 | * | 2/2004 | Murrell et al. | ......... 250/492.21 |
| 6,768,121 B2 | * | 7/2004 | Horsky et al. | .............. 250/427 |
| 6,777,686 B2 | * | 8/2004 | Olson et al. | ............ 250/423 R |
| 7,022,999 B2 | * | 4/2006 | Horsky et al. | .............. 250/427 |

* cited by examiner

*Primary Examiner*—David A. Vanore
(74) *Attorney, Agent, or Firm*—Lathrop & Gage LC

(57) ABSTRACT

An apparatus and a method are disclosed for rapidly controlling the rate of ion generation in an ion source. The ion source includes an ion chamber, filament-cathode, a mirror electrode, and a grid. The ion source is operable to generate an ion beam from the ionization of ion precursor gas present in the ion chamber by electrons emitted from the filament. The rate of ion generation is controlled by modifying the potential of the grid relative to the filament to control the number of electrons available for ionization between the grid and the mirror electrode. An alternative embodiment for rapidly controlling the rate of ion generation in an ion source is also disclosed. In the alternative embodiment, the ion source comprises an ion chamber having mutually opposed sides and configured to receive ion precursor gas; a filament-cathode located on one side of said ion chamber and operable to emit electrons for the ionization of the precursor gas for the generation of the ion beam; and a mirror electrode having a potential associated therewith and located on the other side of said ion chamber. The mirror electrode is connected to a circuit to vary its potential relative to said filament so as to vary the number of the electrons available in the ion chamber for ionization.

26 Claims, 2 Drawing Sheets

SYSTEM AND METHOD FOR RAPIDLY CONTROLLING THE OUTPUT OF AN ION SOURCE FOR ION IMPLANTATION

RELATED INFORMATION

This invention claims priority to U.S. Provisional Patent Application Ser. No. 60/242,288, entitled "System and Method for Rapidly Controlling the Output of Ion Source for Ion Implantation", filed Oct. 20, 2000 and incorporated herein by reference.

FIELD OF INVENTION

This invention relates generally to ion sources used in ion implantation systems, and specifically, to control of ion sources. More particularly, this invention relates to systems and methods for rapidly controlling conventional Bernas type ion source chamber system operations.

BACKGROUND OF THE INVENTION

The development of the ion implantation industry continues to increase demand for systems having higher ion beam current capacity, which has led to performance challenges such as instability and slow responsiveness. In the manufacture of semiconductor devices in the past, semiconductor wafers were modified by diffusing or implanting positive or negative ions (dopants), formed from precursors such as boron, phosphorus, arsenic, antimony into the body of the wafer to produce regions having varying conductivity. Various ion implanters are known, using several types of ion sources. In most ion sources, an ion beam of a preselected chemical species is generated by means of the current applied to a filament within an ion source chamber coupled to a power supply and fitted with an ion precursor gas feed. The ions are extracted in the form of an ion beam through an aperture in the ion source chamber by means of a potential between the source chamber, which is positive, and an extraction means. The beam is directed to an acceleration system, a magnetic analysis stage that separates the desired ions from unwanted ions on the basis of mass, and a post acceleration stage that ensures delivery of the required ions at the required beam current level to the target or substrate wafer to be implanted. The size and intensity of the generated ion beam can be tailored by system design and operating conditions; for example, the current applied to the filament can be varied to regulate the intensity of the ion beam emitted from the ion source chamber.

The most common type of ion sources used for ion implanters are a Freeman source and a Bernas source. In the Freeman source, a rod-like filament, or cathode, made of tungsten or tungsten alloy is passed into an ion chamber (sometimes known as an "arc chamber") whose walls are the anode. The ion chamber includes a gas feed for delivering the desired gas into the chamber for use in generating the desired ions, a filament supply for heating the filament to about 2000 degrees Kelvin up to about 2800 degrees Kelvin to emit thermal electrons, and an exit aperture. A magnet is provided that applies a magnetic field parallel to the filament to increase the electron path length and to suspend the plasma (ions and electrons) within the chamber. Numerous other features and aspects of the Freeman type ion chamber are shown and described in U.S. Pat. No. 4,754,200, the teachings of which are incorporated herein by reference.

The Bernas type ion chamber is substantially identical to the Freeman-type chamber and differs primarily in that the Bernas chamber uses a filament in the form of a loop at one end of the ion chamber in contrast to the rod-like filament that extends through the Freeman ion chamber. Other aspects of the Bernas ion chamber are shown and described in U.S. Pat. No. 5,262,652, the teachings of which are incorporated herein by reference.

In both the Freeman and the Bernas ion chambers, when power is supplied to the filament, the filament temperature increases until electrons are emitted that bombard and breakup the precursor gas molecules such that a plasma is formed containing the electrons and various ions. The ions are emitted from the ion source chamber through the exit aperture and are selectively passed to the target as the ion beam.

For stable ion source operation in Freeman and Bernas sources, the arc voltage and the arc current are required to be relatively constant. This was accomplished through control of the arc current by a feedback loop that controlled filament power, as explained in detail in the '200 and '652 patents. If the arc current dropped, an arc current measuring circuit together with arc current error circuit would alter the filament power control circuit to bring the actual arc current back to the level demanded. Because of the thermal inertia of a high-resistance filament, the filament power control loop for maintaining constant arc current responds relatively slowly to changes in programming.

An attempt to overcome these problems used an ion implanter having an ion chamber that operated to maintain the ion beam current by varying the arc voltage on the filament cathode while supplying direct current electrical power across the filament cathode (as described in the '200 patent). In particular, the '200 patent teaches a scheme of control that varies the arc voltage to provide a faster response while using a slower servo on the filament to maintain the beam current at the desired value.

This ion chamber is not ideal for large ranges of control since the ionization efficiency depends on the arc voltage, and the beam current extracted from the source will not remain constant if the arc voltage is varied over a wide range even if the arc current is kept constant.

The mirror electrodes in the prior art are connected to the filament cathode or are left floating. In either case, the mirror electrode charges up to the filament potential and the electrons from the filament do not have the energy to reach the electrode.

Thus, what is needed is an ion source that can rapidly control the number of electrons available for ionization.

SUMMARY OF INVENTION

The present invention provides a control system for rapidly controlling the output of an ion source for use in ion implantation. The invention resides in the discovery that superior stability and rapid control can be obtained by electrically controlling electron flux within the ion chamber rather than by relying on thermal control of the ion chamber filament or changes in arc voltage.

According to one aspect of the invention, an improved ion source has been invented for rapidly modulating the intensity of an ion beam. The ion source comprises an ion chamber having mutually opposed sides and configured to receive ion precursor gas; a filament-cathode located on one side of said ion chamber and operable to emit electrons for the ionization of the precursor gas for the generation of the ion beam; and a mirror electrode having a potential associated therewith and located on the other side of said ion chamber. The mirror electrode of this aspect of the invention is connected to a circuit that enables the mirror electrode to vary its potential relative to the filament so as to vary the number of the electrons available in the ion chamber for ionization.

In another aspect of the present invention, the ion source for rapidly modulating the intensity of an ion beam comprises an ion chamber having mutually opposed sides and configured to receive ion precursor gas; a filament-cathode located on one side of the ion chamber and operable to emit electrons for the ionization of the precursor gas for the generation of the ion beam; a mirror electrode located on the other side of said ion chamber, and a grid connected to a circuit to vary the grid's potential relative to the filament. The grid is operable to control the number of the electrons available in the ion chamber for ionization.

Other features and advantages of the invention will become apparent from the following description and from the claims.

DETAILED DESCRIPTION

Figure 1:
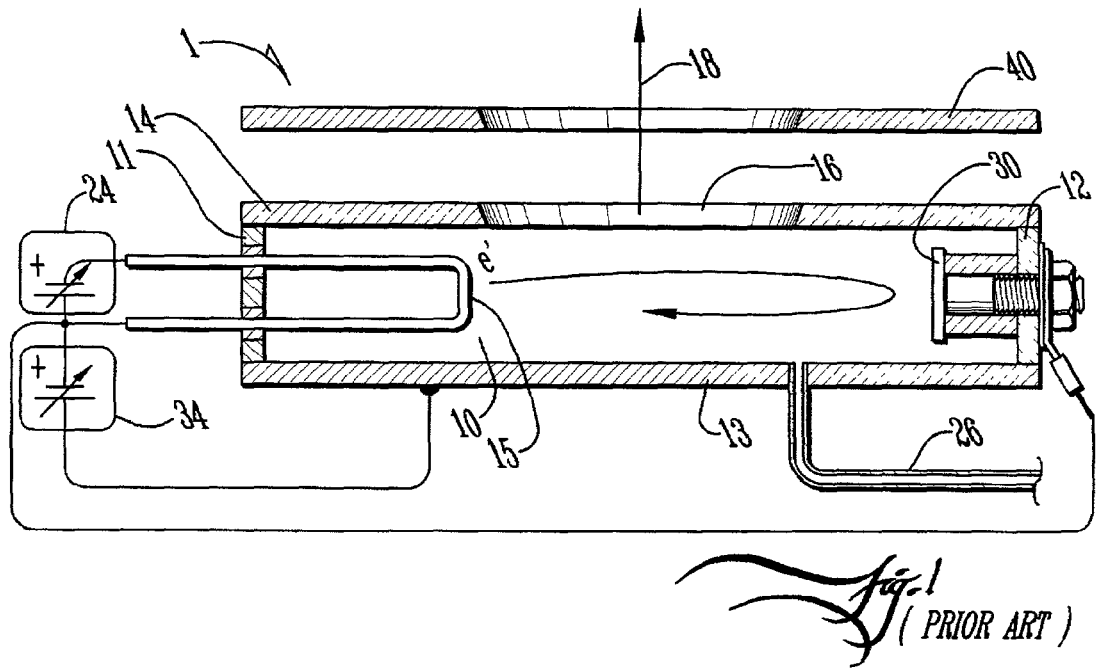
FIG. 1 is a schematic of the Bernas type ion chamber showing a typical electrical control circuit for the maintenance of the voltage potential between the filament, chamber walls and electrode mirror.

As an aid to understanding the present invention, reference is made to FIG. 1 which shows a conventional Bernas ion source 1. This ion source 1 includes an ion chamber 10 and an extraction electrode assembly 40 that extracts an ion beam 18 from the ion chamber. The ion chamber 10 includes first and second sides 11, 12, walls 13, 14 that form the anode, a filament 15 acting as a cathode that passes through first side 11, a filament power supply 24 and a mirror electrode 30 which is electrically coupled to one side of filament 15, and passes through second side 12. The ion chamber 10 is fitted with a gas feed 26 to supply ion precursor gas into ion chamber 10 and an exit slit 16 located in wall 14 through which ion beam 18 is extracted from chamber 10. Once ion beam 18 is extracted, extraction electrode assembly 40 accelerates ion beam 18 toward a mass analyzing system associated with an ion implanter (not shown).

An arc power supply 34 is configured to apply a voltage, typically in a range of 30 to 170 volts, between filament 15, anode walls 13,14 and mirror electrode 30 so that the electrons emitted from the hot filament are driven away from filament 15 toward the center of the ion chamber. The emitted electrons are confined by a magnetic field induced within the ion chamber 10 by a magnet (not shown) to prevent the electrons from traveling to sides 11, 12, and walls 13 and 14. Mirror electrode 30 located at the opposite end of ion chamber 10 repels the emitted electrons back toward filament 15. The emitted electrons thus oscillate in the area within ion chamber 10 between filament 15 and the mirror electrode 30 to produce a plasma of positively charged ions created from the collision of the emitted electrons and the ion precursor gas admitted into ion chamber through gas feed 26. The number of ions produced determines the intensity of beam 18 and the number of ions produced is generally controlled by monitoring the current between filament 15 and walls 13,14 ("arc current") and adjusting and regulating the current supplied to filament 15, and thus its temperature, by filament power supply 24.

Figure 2:
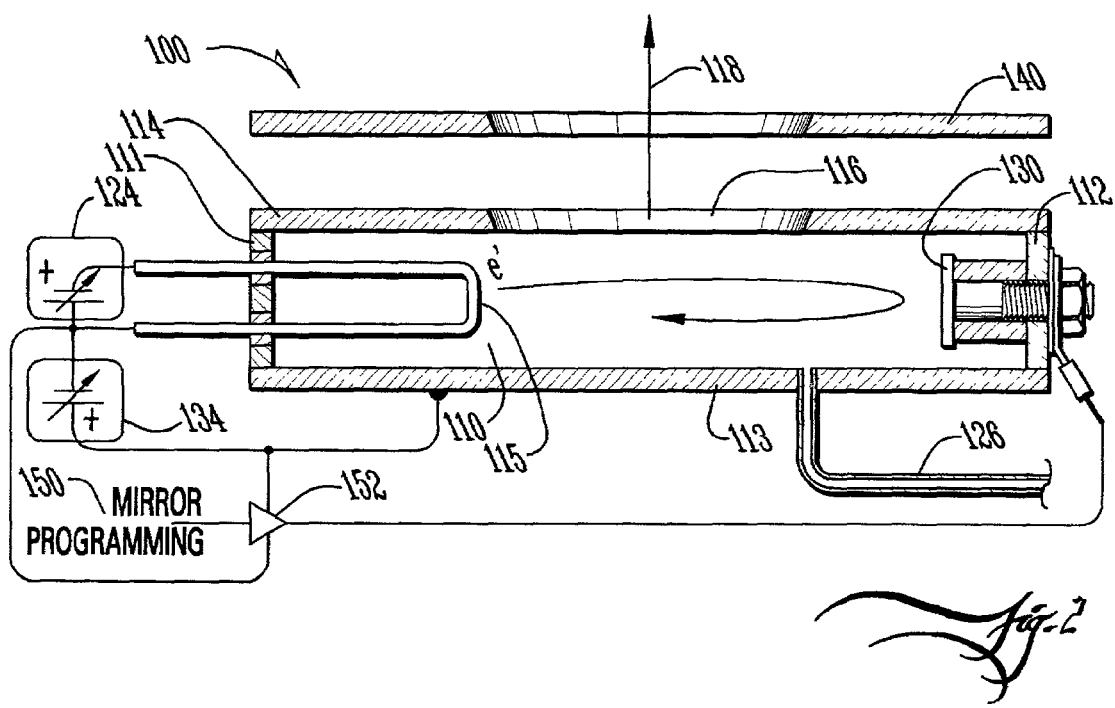
FIG. 2 is a schematic of an ion chamber of the present invention which includes an electric circuit that permits the application of an amplified potential on the mirror electrode thermal ions.

The improvements associated with the present invention facilitate rapid adjustment and regulation of the ion beam extracted from the ion chamber. More particularly, an ion source that allows fast control of the number of electrons available within the ion chamber for ionization is shown in FIG. 2 as 100. The ion source 100 includes an ion chamber 110 having first and second mutually opposed sides 111,112, and walls 113,114 which collectively define the ion chamber 110 and form the anode. A filament-cathode 115 extends through first side 111 and is coupled to a filament power supply 124 and a mirror electrode 130 disposed in second side wall 112. An extraction electrode assembly 140 extracts ion beam 118 through exit slit 116. An ion beam 118 and associated arc current and ion plasma are generated in the conventional manner described above for the Bernas ion chamber. The chamber 110 further includes an ion precursor gas feed 126 and an exit slit 116 which is located in wall 114 of ion chamber 110.

It will be understood by those skilled in the art that the filament 115 (or directly heated cathode) may be replaced with an indirectly heated cathode.

An arc power supply 134 is electrically coupled to filament 115 and ion chamber walls 113, 114. A mirror programming circuit 150 is electrically coupled to filament power supply 124, arc power supply 134 and mirror electrode 130 as shown in FIG. 2. Mirror programming circuit 150 is operable to control the potential on mirror electrode 130 relative to filament 115. Specifically, mirror programming circuit 150 controls the number of electrons trapped between the filament and mirror electrode and thus the rate of ionization of the gas and the resulting beam current. Mirror programming circuit 150 drives the voltage potential on mirror electrode 130 to approach the voltage potential of either filament 115—in the case where beam intensity is to be increased—or walls 113, 114—in the case where the beam intensity is to be decreased. When the error signal 152 potential approaches that of filament 115, the number of electrons available for ionization is increased because the potential imposed on mirror electrode 130 repels electrons back toward the center of the chamber. When the error signal potential approaches that of walls 113, 114 and thus the signal 152 potential is positive relative to filament 115 electrons are attracted to and absorbed by the mirror. This reduces the number of electrons available for ionization and, in turn, reduces the rate of ionization of the gas and results in the desired reduction in beam intensity.

Figure 4:
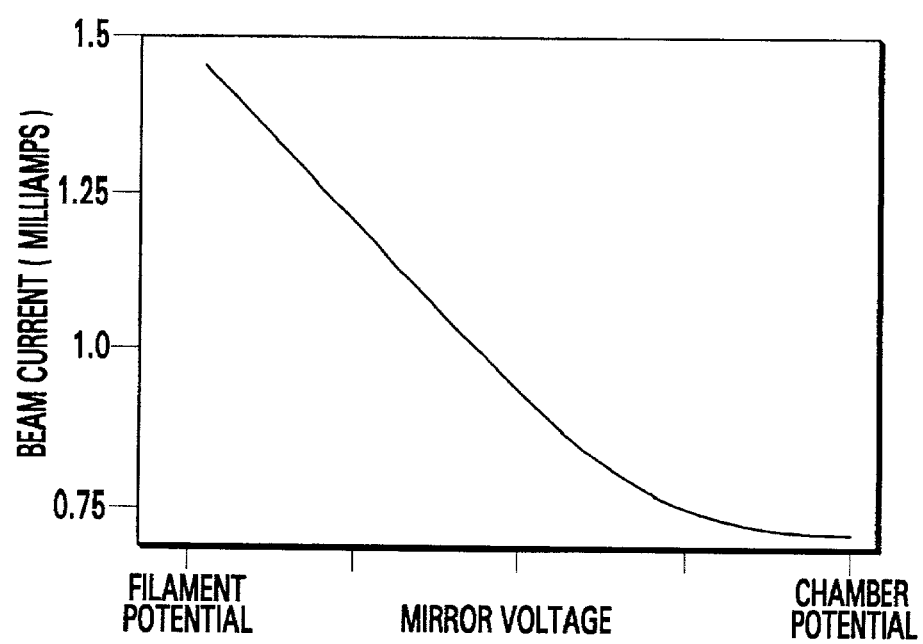
FIG. 4 is a plot of beam current vs. mirror voltage achievable during operation of the ion chamber shown in FIG. 2.

Shown in FIG. 4 is a plot showing the relationship of beam current to mirror voltage encountered during the operation of the ion chamber shown in FIG. 2. The plot shows the reduction in beam current that can be achieved by driving the mirror voltage potential toward the potential of the chamber wall. Specifically, FIG. 4 shows how the beam current, and thus beam intensity, can be reduced by driving the mirror electrode voltage potential from that imposed on the filament to that imposed on the chamber wall. When making adjustments to the beam current, the difference in ion chamber system response time between the prior art systems discussed above and the present invention is significant. The heating and cooling of the filament in the prior art has typically about a 0.5 second time constant because of the heat capacity of the filament. By contrast, the electron transit time across the arc chamber is measured in microseconds, so response times below 10 to 20 microseconds can be expected from the control of the electronic flux by the system shown in FIG. 2.

The embodiment of the present invention shown in FIG. 2 has the additional advantage of requiring no appreciable changes in the construction of the ion source chamber itself. In this embodiment, however, the ionization rate cannot be reduced to zero since the electrons must travel at least once through the center of the chamber before being attracted to and absorbed by electrode mirror 130.

Figure 3:
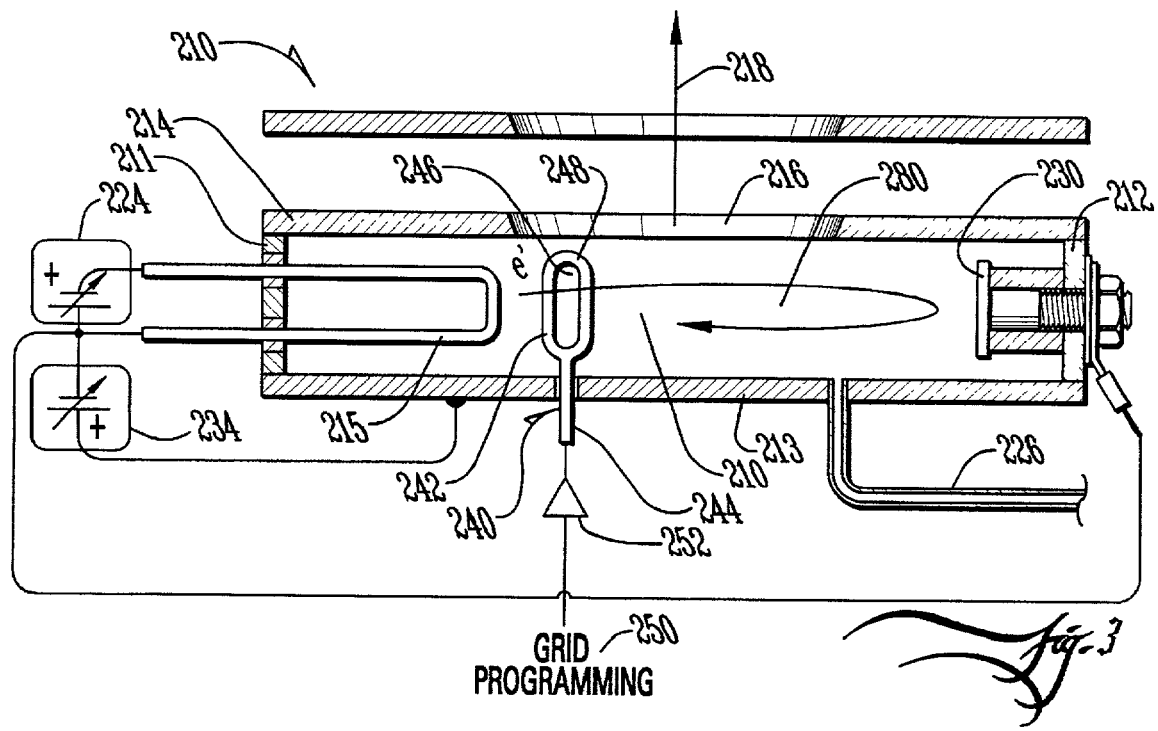
FIG. 3 is a schematic of an alternative embodiment of the ion source of the present invention grid positioned within the ion chamber in close proximity to the filament.

Shown in FIG. 3 is an alternative embodiment of the ion source of the present invention. In this embodiment, an electrode with an aperture is introduced between filament 215 and the remainder of the ion chamber 210. The chamber 210 comprises first and second sides 211, 212 and walls 213, 214, which define the ion chamber and form the anode. Similar to the first embodiment of the present invention, ion chamber 210 is fitted with filament 215 (acting as the cathode) that extends through first side 211, a filament power supply 224 coupled to filament 215, a gas feed 226 and a mirror electrode 230 disposed within wall 212. The resulting ion beam 218 passes through exit slit 216 disposed in wall 214. However, this embodiment includes a grid electrode 240 having an O-shaped grid portion 242 and an outwardly extending support leg 244 as shown in FIG 3. Grid portion 242 presents aperture 246 defined by loop portion 248. Leg 244 passes through and is secured to wall 213 so that grid electrode 240 can be located within ion chamber 210 with the grid portion 242 located in relative proximity to filament 215. Grid electrode 240 is configured to operate like a grid in a conventional vacuum tube and thus it will be understood that more than one grid may be employed in the ion source without departing from the scope of the present invention.

Arc power supply 234 is electrically coupled to filament 215 (cathode), walls 213,214 (anode), filament power supply 224, and electrode mirror 230. A power supply 234 is operable to drive the grid 240 negative or positive relative to filament 215. Specifically, grid programming circuit 250 is electrically coupled to grid 240 and receives signal 252 which is chosen to produce the desired ion beam intensity. Grid programming circuit 250 is operable to negatively bias electrode grid 240 relative to filament 215 in response to signal 252 to retard electrons emitted from filament 215 so that the number of electrons flowing into center region 280 of ion chamber 210 are reduced thereby reducing the rate of ionization. Alternatively, the grid can be driven to or near the potential of filament 215 to allow electrons to flow from the filament to the electrode mirror 230, in the same manner as the embodiment in FIG. 2. In all other respects, the embodiment of the present invention shown in FIG. 3 operates identical to that set forth in the embodiment described above and shown in FIG. 2. It is also possible to direct the potential of grid 240 positive relative to the filament 215 to absorb electrons in the same manner as the mirror electrode is operated in the previous embodiment.

Thus, the principal advantage of this embodiment of the present invention is to provide an extended range of control over that associated with the embodiment described above and shown in FIG. 2. Specifically, the grid embodiment enables the ion source to throttle the ion production down to nearly zero. This embodiment includes an additional advantage in that electrons currents which are otherwise limited by space charge are inherently less noisy than those which are temperature limited so the ion beam produced will be correspondingly less noisy.

The invention thus attains the objects set forth above and those apparent from the preceding description. Since certain changes may be made in the above systems and methods without departing from the scope of the invention, it is intended that all matter contained in the above description or shown in the accompanying drawing be interpreted as illustrative and not in a limiting sense.

What is claimed is:

1. A method for rapidly controlling the rate of ion generation in an ion source having a filament-cathode and a mirror electrode within walls of a chamber, the filament-cathode and the mirror electrode being opposed along a first direction without intervening structure, the ion source being operable to generate an ion beam from the ionization of an ion precursor gas present in the chamber by electrons emitted from the filament-cathode, the method comprising the steps of:

applying a first potential to a positive end of the filament-cathode, relative to a potential at a negative end of the filament-cathode;

applying a second potential to the walls of the chamber, relative to the potential at the negative end of the filament-cathode;

controlling the potential of the mirror electrode between the potential at the negative end of the filament-cathode and the second potential, to control the number of electrons available for ionization; and emitting the ion beam from the chamber in a second direction that is generally perpendicular to the first direction.

2. The method of claim 1 wherein the step of controlling comprises reducing an ion beam intensity by driving the potential of the mirror electrode toward the second potential.

3. The method of claim 1 further comprising the step of increasing an ion beam intensity by driving the potential of the mirror electrode toward the potential at the negative end of the filament-cathode.

4. The method of claim 1 wherein the filament-cathode is a directly heated filament-cathode.

5. The method of claim 1 wherein the filament-cathode is an indirectly heated filament-cathode.

6. The method of claim 1 further comprising the step of modulating the number of electrons in a manner that varies the ion beam from a first intensity to a second intensity during a time frame of less than one millisecond.

7. A method for rapidly controlling the rate of ion generation in an ion source having a filament-cathode and a mirror electrode within walls of a chamber, the filament-cathode and the mirror electrode being opposed along a first direction, and at least one grid electrode having an O-shaped grid portion located between the filament-cathode and the mirror electrode along the first direction, the ion source being operable to generate an ion beam from the ionization of an ion precursor gas present in a chamber by electrons emitted from the filament-cathode, the method comprising the steps of:

applying a potential to the filament-cathode, relative to a potential at a negative end of the filament-cathode;

connecting said mirror electrode to the potential at the negative end of the filament-cathode;

controlling the potential of the grid electrode positive or negative relative to the filament-cathode to control the number of electrons available for ionization between the grid electrode and the mirror electrode; and emitting the ion beam from the chamber in a second direction that is generally perpendicular to the first direction.

8. The method of claim 7 wherein the step of controlling comprises reducing an ion beam intensity by driving the potential of the grid electrode negative relative to the filament-cathode.

9. The method of claim 7 wherein the step of controlling comprises increasing an ion beam intensity by driving the potential of the grid electrode to or near the potential of the filament-cathode.

10. The method of claim 7 wherein the filament-cathode is a directly heated filament-cathode.

11. The method of claim 7 wherein the filament-cathode is an indirectly heated filament-cathode.

12. The method of claim 7 further comprising the step of modulating the number of electrons in a manner that varies the ion beam from a first intensity to a second intensity during a time frame of less than one millisecond.

13. An ion source apparatus for rapidly modulating an intensity of an ion beam, comprising:
an ion chamber having mutually opposed walls that are fixed at a wall potential, one of the walls forming an aperture for emitting the ion beam in a first direction, the chamber configured to receive an ion precursor gas;
a filament-cathode that is located on one side of said ion chamber, fixed at a filament-cathode potential and operable to emit electrons for ionization of the ion precursor gas for generation of the ion beam; and
a mirror electrode having a potential associated therewith and located on the other side of said ion chamber in a second direction relative to the filament-cathode, the second direction being approximately perpendicular to the first direction, said mirror electrode being connected to a circuit to vary its potential relative to said wall potential and the filament-cathode potential so as to vary the number of the electrons available in the ion chamber for ionization.

14. The apparatus of claim 13 wherein said mirror electrode is operable for modulating the ion beam from a first intensity to a second intensity during a time frame of less than 1 millisecond.

15. The apparatus of claim 13 wherein the filament-cathode is a directly heated filament-cathode.

16. The apparatus of claim 13 wherein the filament-cathode is an indirectly heated filament-cathode.

17. An ion source apparatus for rapidly modulating an intensity of an ion beam, comprising:
an ion chamber having mutually opposed walls that are fixed at a wall potential, one of the walls forming an aperture for emitting the ion beam in a first direction, the chamber configured to receive an ion precursor gas;
a filament-cathode that is located on one side of said ion chamber, fixed at a filament potential and operable to emit electrons for ionization of the ion precursor gas for generation of the ion beam;
a mirror electrode located on the other side of said ion chamber in a second direction relative to the filament-cathode, the second direction being approximately perpendicular to the first direction, and
at least one grid electrode extending inside said ion chamber and positioned between said filament-cathode and said mirror electrode along the second direction, said at least one grid electrode being connected to a circuit operable to vary a potential of the grid electrode positive or negative relative to said filament-cathode so as to vary the number of electrons available in the ion chamber for ionization.

18. The apparatus of claim 17 wherein the filament-cathode is a directly heated filament-cathode.

19. The apparatus of claim 17 wherein the filament-cathode is an indirectly heated filament-cathode.

20. The apparatus of claim 17 wherein said at least one grid electrode is positioned in proximity to said filament-cathode so as to vary the number of electrons available for ionization between said at least one grid electrode and said mirror electrode.

21. The apparatus of claim 17 wherein the grid electrode includes an O-shaped grid portion.

22. In a Bernas-type ion source having a filament-cathode and a mirror electrode disposed along a first direction within a chamber, the ion source being operable to generate an ion beam from the ionization of an ion precursor gas in the chamber by electrons emitted from the filament-cathode, the chamber having walls, one wall forming an aperture to allow emission of the ion beam from the chamber in a second direction that is generally perpendicular to the first direction, an improvement comprising:
a mirror electrode programming circuit for controlling a potential of the mirror electrode between a potential of the filament-cathode and a potential of the walls.

23. In a Bernas-type ion source having a filament-cathode and a mirror electrode disposed along a first direction within a chamber, the ion source being operable to generate an ion beam from the ionization of an ion precursor gas in the chamber by electrons emitted from the filament-cathode, the chamber having walls, one wall forming an aperture to allow emission of the ion beam from the chamber in a second direction that is generally perpendicular to the first direction, an improvement comprising:
at least one grid electrode located between said filament-cathode and said mirror electrode along the second direction; and
a grid programming circuit for controlling a potential of the grid electrode positive or negative relative to a potential of the filament-cathode.

24. Ion source of claim 23, wherein the grid electrode includes an O-shaped grid portion.

25. Ion source of claim 23, wherein the grid electrode is located in relative proximity to the filament-cathode.

26. Ion source of claim 23, wherein the grid electrode includes a plurality of grids.

* * * * *